(12) United States Patent
Kraemer

(10) Patent No.: US 7,489,179 B2
(45) Date of Patent: Feb. 10, 2009

(54) ELECTRONIC HIGH-FREQUENCY SWITCH AND ATTENUATOR WITH SAID HIGH-FREQUENCY SWITCHES

(75) Inventor: Wilhelm Kraemer, Bad Reichenhall (DE)

(73) Assignee: Rohde & Schwarz GmbH & Co., KG, Munich (DE)

( * ) Notice: Subject to any disclaimer, the term of this patent is extended or adjusted under 35 U.S.C. 154(b) by 130 days.

(21) Appl. No.: 10/582,993

(22) PCT Filed: Nov. 29, 2004

(86) PCT No.: PCT/EP2004/013540

§ 371 (c)(1),
(2), (4) Date: Jun. 12, 2006

(87) PCT Pub. No.: WO2005/060096

PCT Pub. Date: Jun. 30, 2005

(65) Prior Publication Data
US 2007/0085627 A1  Apr. 19, 2007

(30) Foreign Application Priority Data
Dec. 17, 2003  (DE) ............................... 103 59 298
Feb. 4, 2004   (DE) ....................... 10 2004 005 531

(51) Int. Cl.
*H03K 17/687* (2006.01)
(52) U.S. Cl. .................. 327/435; 327/306; 327/308
(58) Field of Classification Search ................ 327/306, 327/308, 435; 333/81 R, 103
See application file for complete search history.

(56) References Cited

U.S. PATENT DOCUMENTS

| 3,757,139 | A | | 9/1973 | Hunter |
| 4,975,604 | A | * | 12/1990 | Barta ......................... 327/308 |
| 5,796,286 | A | * | 8/1998 | Otaka ......................... 327/308 |
| 6,873,200 | B2 | * | 3/2005 | Evers et al. .................. 327/365 |
| 2001/0007430 | A1 | * | 7/2001 | Goodell ....................... 327/308 |
| 2001/0033206 | A1 | * | 10/2001 | Constantine et al. ...... 333/81 R |
| 2002/0196098 | A1 | * | 12/2002 | Sasabata et al. ........... 333/81 R |

FOREIGN PATENT DOCUMENTS

DE  100 63 999 A1  8/2002

OTHER PUBLICATIONS

Kovacs F.: "High-Frequency Applications of Semiconductor Devices" 1981, Elsevier, Amsterdam—The Netherlands, XP002321427, pp. 49-55.

* cited by examiner

*Primary Examiner*—Kenneth B Wells
*Assistant Examiner*—John W Poos
(74) *Attorney, Agent, or Firm*—Christensen O'Connor Johnson Kindness PLLC

(57) ABSTRACT

In an electronic high-frequency switch, comprising a field-effect transistor as the switching element, the size of the gate voltage may be switched between at least two values (−5.5 V and −8 V), according to the desired linearity or switching speed. The switching device for the gate voltage is preferably coupled to a correction device in which different correcting values for the different gate voltage values corresponding to different correcting values for transmission or reflection by the high frequency switch are stored.

3 Claims, 1 Drawing Sheet

Figure 1:
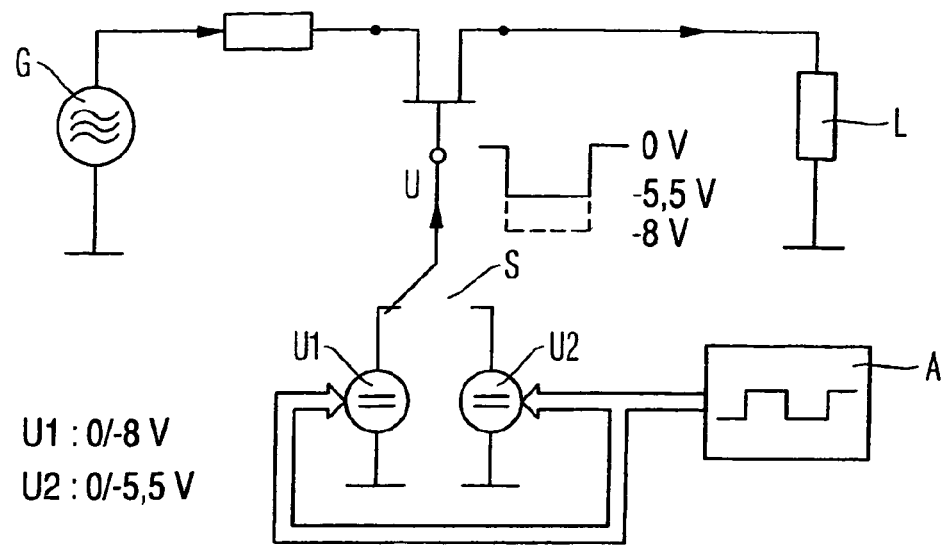

ELECTRONIC HIGH-FREQUENCY SWITCH AND ATTENUATOR WITH SAID HIGH-FREQUENCY SWITCHES

The invention relates to an electronic high frequency switch with a field-effect transistor as switching element according to the preamble of the main claim.

Electronic high frequency switches of this type having, for example, gallium arsenide field effect transistors as switching elements have now become indispensable in modern measuring equipment. They are used both as individual on-off switches or changeover switches or used combined together, for example, in attenuators. Ideally, high frequency switches of this type should be highly linear in order to generate the least possible intermodulation products. It is only by this means that, for example, signal generators having downstream attenuators can be manufactured with good ACLR values. A precondition for a high degree of linearity, however, is that the gate DC voltage used for switching the transistor has a relatively high value. However, the larger the gate switching voltage is, the slower the switching process of the high frequency switch becomes.

An electronic attenuator with field effect transistors is disclosed, for example, by DE 100 63 999 A1.

It is an object of the invention to provide an electronic high frequency switch and an attenuator with said high frequency switches whose properties with regard to linearity and switching speed can be optimally selected by the user for the respective application in question.

This aim is achieved on the basis of an electronic high frequency switch according to the preamble of claim 1 by means of its characterising features. The aim is fulfilled with respect to the attenuator by the features of claim 3. Advantageous further developments, with regard particularly to its application in an attenuator, are given in the subclaims.

The high frequency switch according to the invention can be operated by the user at any time with the respective desired optimum properties with regard to linearity and switching speed. With a simple additional changeover switching device, the size of the gate DC voltage for the field effect transistor may be chosen by the user such that the high frequency switch has either a high level of linearity or a high switching speed. High linearity is achieved for a particular GaAs field effect transistor type with, for example, a relatively high gate DC voltage of −8V. If the gate DC voltage is reduced, for example, to −5.5V, the switching time may be accelerated by a factor of at least ten, although the linearity is thereby worsened.

By means of the changeover and by changing the gate switching voltage, apart from the linearity and the switching speed, other high frequency properties of the switch are also altered, even if not so drastically as the linearity and the switching speed. It may therefore be advantageous to compensate for these changes in other high frequency properties of the switch that are caused by changing the gate switching voltage, such as transmission or reflection, through corresponding correction values, and this is the subject matter of the subclaims.

Changes in transmission, for example, junction loss in an attenuator can be compensated for depending on the frequency, either through suitable intervention in the circuit itself or by suitably influencing the software controlling the switch, changes to the level of reflection through suitable intervention in the circuit, for example, by connecting in additional components such as capacitors or the like synchronously with the switching over of the gate switching voltage.

With an attenuator wherein attenuation members are switched on or off in series or bridged by means of a plurality of electronic high frequency switches, it may be advantageous similarly to control only a part of the high frequency switches utilised for linearity or switching speed. For the continuous conducting branch of an attenuator it may, for example, be advantageous to select the high frequency switches provided there optimised for linearity (with a relatively high gate switching voltage), whilst the subsidiary branches lying parallel thereto are optimised with regard to switching speed (with a relatively low gate switching voltage).

The gate switching voltage can also be switchable, depending upon the application, between three or more finely stepped values. A continuous change between a maximum and a minimum gate voltage value is also conceivable.

Figure 2:
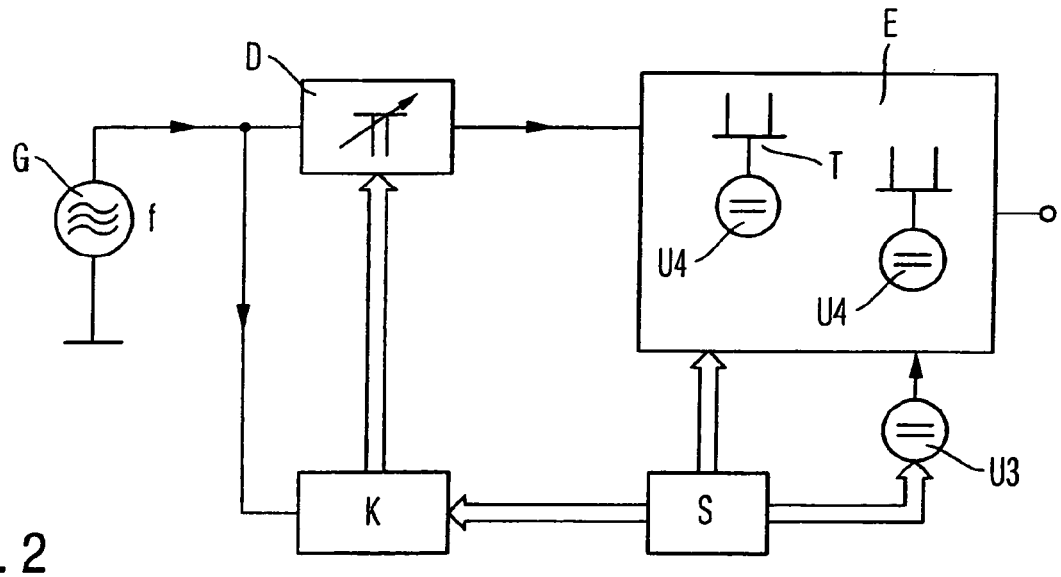
Figure 3:
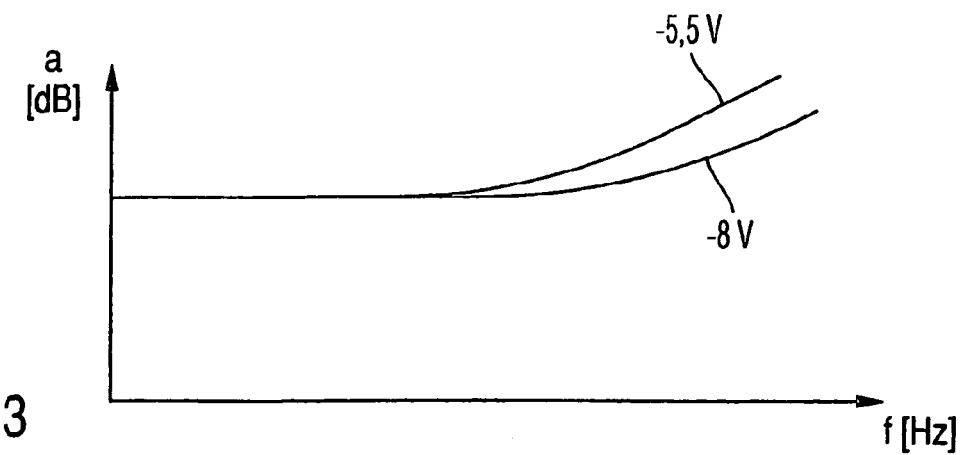

The invention will now be described in greater detail using exemplary embodiments illustrated in schematic drawings, in which:

FIG. 1 shows the principle of the circuit of an HF switch according to the invention, FIG. 2 shows its use in an attenuator, and FIG. 3 shows the frequency response of the junction loss of this attenuator.

FIG. 1 shows an electronic high frequency switch with a field effect transistor T, which, for example, is designed using GaAs technology and whose source-drain path is connected as a switching element between a high frequency source G and a consumer L. The transistor T is switched on and off via its gate voltage U. Depending on the transistor type, for example, with a gate voltage of 0V (in practice usually −0.6V), the transistor is conductive and therefore connects the signal from the high frequency source G to the consumer L. By applying a negative gate voltage U of, for example, −8V to the gate of the transistor, it is blocked and the source G is therefore disconnected from the consumer.

According to the invention, the size of the gate switching voltage U may be selected with a changeover switch S and, in the exemplary embodiment shown here, for the transistor type used by way of example, between two separate voltage sources U1 and U2. One switchable voltage source U1, controlled via the switching control A, supplies either 0V for the "On" condition or −8V for the "Off" condition, whereas the second switchable voltage source U2 supplies either 0V for the "On" condition or −5.5V for the "Off" condition. The user of a measuring device into which this high frequency switching transistor T is installed can therefore choose with the changeover switch S whether, for the current measuring procedure, a high degree of linearity (large gate voltage of, for example, −8V) or a high switching speed (small gate voltage of, for example, −5.5V) is required for the high frequency switch.

FIG. 2 illustrates the use of an electronic high frequency switch of this type in an attenuator E in which a plurality of high frequency switches of this type are used for parallel and/or series switching of attenuation members between the input and the output of the attenuator. Attenuators of this type are known per se. The gate voltage for the individual switching transistors T is either derived from a common control voltage source U3 or separate gate voltage sources are provided in the attenuator for the individual switching transistors, as is schematically indicated in FIG. 2 with the voltage sources U4. In both cases, these gate voltage sources are switchable, as in FIG. 1, between at least two different values, so that either optimum linearity or optimum switching speed may be selected.

The size of the gate switching voltage influences not only the linearity and the switching speed, but also other high frequency properties of the switch, such as the transmission or reflection. According to a further development of the invention, it has therefore proved to be advantageous to couple the changeover device S for the gate voltage to a corresponding correction device K in which correction values for compensating for these other high frequency properties of the high frequency switch are stored and which, depending on the switching position of the changeover device S, are read from the correction device K and used for additional correction of the high frequency switch.

With attenuators, it is known, for correction of the frequency-dependent junction loss generated across the high frequency switches that are used, to connect an additional switchable attenuation member D before the actual attenuator, said attenuation member being controllable via a correction device K dependent upon the frequency f set on the generator G. The junction loss generated in the attenuator E by the high frequency switch has, for example, the shape shown in FIG. 3, i.e. as the frequency increases, the junction loss becomes greater. Therefore with the known device, as the frequency increases, the attenuation member D is switched back to smaller values, so that at the output of the attenuator this frequency response is compensated for accordingly. The associated correction values are stored in the correction device K.

The attenuation member D could also be an electronically continuously variable attenuation member which itself is part of a regulation loop. The correction value could then be overlaid on the reference voltage.

According to the further development of the invention, the changeover device S for the switchable gate switching voltage U3 or U4 is additionally linked to this correction device K and in the correction device K, for each selectable gate switching voltage, corresponding different correction values are stored in frequency-dependent manner so that, for example, on selection of the gate switching voltage as −8V, a flatter response curve is stored as the correction value than for −5.5V, as shown in FIG. 3.

In comparable manner, by suitable intervention in the circuit of the high frequency switch or the attenuator, the transmission or reflection properties of the switch may be corrected depending on the respective gate switching voltage selected. In place of an adjustable attenuation member, an adjustable amplifier could also be used for transmission correction.

The invention is not restricted to the exemplary embodiment shown. All the features described may be combined with each other as desired.

The invention claimed is:

1. An electronic high frequency switch with a field effect transistor as the switching element, whose switching condition is controlled via the gate voltage fed from a gate voltage source and is controlled by means of a control circuit between a switching on value and switching off value, characterized in that the size of the gate voltage fed from the gate voltage source is selectable between a first voltage and a second voltage by a changeover device depending on the desired linearity or switching speed, wherein neither the first voltage nor the second voltage is a ground voltage;

wherein the changeover device for the gate voltage is coupled to a correction device in which, for the different gate voltage values, corresponding different correction values for additional high frequency properties of said high frequency switch (transmission or reflection) are stored which, depending on the gate voltage chosen, are used for correcting these additional high frequency properties of said high frequency switch.

2. An attenuator having a plurality of electronic high frequency switches according to claim 1, characterized in that the size of the gate voltage of at least some of said high frequency switches are switchable between at least two values.

3. Attenuator according to claim 2, with a switchable attenuation member connected on the line side, which is controllable with a correction device in which, depending on the frequency of the high frequency signal fed to the attenuator, correction values for compensating for the frequency-dependent junction loss of the electronic high frequency switch are stored, characterized in that in the correction device, different frequency response correction values are stored for the different gate voltage values of the high frequency switches and that the changeover device for the gate voltage is coupled to this correction device such that, depending on the selected size of the gate voltage, the respective associated frequency response correction values for controlling the attenuation member connected on the line side are used.

* * * * *

UNITED STATES PATENT AND TRADEMARK OFFICE
CERTIFICATE OF CORRECTION

PATENT NO. : 7,489,179 B2  Page 1 of 1
APPLICATION NO. : 10/582993
DATED : February 10, 2009
INVENTOR(S) : W. Kraemer It is certified that error appears in the above-identified patent and that said Letters Patent is hereby corrected as shown below:

| COLUMN | LINE | |
|---|---|---|
| (30) Pg. 1, col. 1 | Foreign Appln. Priority Data | "103 59 298" should read --103 59 298.9-- |
| (30) Pg. 1, col. 1 | Foreign Appln. Priority Data | "10 2004 005 531" should read --10 2004 005 531.9-- |

Signed and Sealed this

Twelfth Day of May, 2009

JOHN DOLL
*Acting Director of the United States Patent and Trademark Office*